United States Patent
Liu et al.

(10) Patent No.: US 7,205,573 B2
(45) Date of Patent: Apr. 17, 2007

(54) LIGHT-EMITTING DEVICE HAVING A COMPOUND SUBSTRATE

(75) Inventors: Wen-Huang Liu, Hsin-Chu (TW); Jen-Shui Wang, Hsin-Chu (TW); Min-Hsun Hsieh, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 90 days.

(21) Appl. No.: 10/708,047

(22) Filed: Feb. 5, 2004

(65) Prior Publication Data
US 2005/0017249 A1 Jan. 27, 2005

(30) Foreign Application Priority Data
Jul. 25, 2003 (TW) .............................. 92120597 A

(51) Int. Cl.
*H01L 27/15* (2006.01)
(52) U.S. Cl. .......................................... 257/79; 257/98

(58) Field of Classification Search ................. 257/79, 257/98
See application file for complete search history.

(56) References Cited

U.S. PATENT DOCUMENTS

| | | | |
|---|---|---|---|
| 6,396,082 B1 * | 5/2002 | Fukasawa et al. ............. 257/79 |
| 6,645,783 B1 * | 11/2003 | Brunner et al. ................ 438/26 |
| 6,874,910 B2 * | 4/2005 | Sugimoto et al. ............ 362/294 |
| 6,876,005 B2 * | 4/2005 | Hsieh et al. ................... 257/84 |
| 2004/0104393 A1 * | 6/2004 | Liu et al. ....................... 257/79 |

* cited by examiner

*Primary Examiner*—Mark V. Prenty
(74) *Attorney, Agent, or Firm*—Winston Hsu

(57) ABSTRACT

A light-emitting device includes a compound substrate including a high thermal conductive layer and a substrate disposed around the high thermal conductive layer, an adhesive layer formed on the compound substrate, and a light-emitting stack layer formed on the adhesive layer. Therefore, problems in cutting a metal layer in a grain cutting process are solved.

35 Claims, 3 Drawing Sheets

LIGHT-EMITTING DEVICE HAVING A COMPOUND SUBSTRATE

BACKGROUND OF INVENTION

1. Field of the Invention

The present invention relates to a light-emitting device, and more particularly, to a light-emitting device with compound substrate.

2. Description of the Prior Art

The applications of light-emitting diodes are extensive and include such applications as optical display devices, traffic signals, data storing devices, communication devices, illumination devices, and medical apparatuses.

Traditionally, materials of light-emitting devices are semiconductors having poor thermal conduction properties. When such a light-emitting device is turned on, the light-emitting device is illuminated and generates heat. However, a semiconductor cannot transmit heat very quickly. If the heat cannot be removed in a reasonable time, the light-emitting device will suffer decreased lighting efficiency because of the excessive heat. For a light-emitting stack layer of AlGaInP at a given operating current, if the external temperature increases from 20C. to 80C., the brightness will decrease 20%~50%. For small-scale light-emitting devices, this problem is not serious because the operating current is low. If the operating current is smaller than 30 mA~50 mA, the heat can be removed from the stack layer. However, in large-scale light-emitting devices where the operating current is larger than 100 mA~1A, if the heat cannot be removed in good time, the increasing temperature will decrease the brightness resulting in low lighting efficiency.

U.S. Pat. No. 6,287,882, which is incorporated herein by reference, discloses a light-emitting diode employing a metal reflecting adhesive to bind a light-emitting unit and a metal substrate so that the light-emitting diode can reflect light and conduct heat. Taiwan (R.O.C.) patent No.151410 discloses a semiconductor element having a metal substrate and a plating method to form the metal substrate on the semiconductor light-emitting stack layer to replace the conventional semiconductor substrate to conduct heat. However, in manufacturing processes of the above two structures, it is difficult to cut the metal substrate in the subsequent process of chip cutting.

SUMMARY OF INVENTION

It is therefore a primary objective of the claimed invention to provide a light-emitting device with compound substrate to solve the above-mentioned problem. The compound substrate comprises a high thermal conductive layer and a substrate disposed around the high thermal conductive layer Thus, the compound substrate provides better thermal conduction to solve the heat cumulation problem.

Another objective of the claimed invention is to provide a light-emitting device with compound substrate to solve the chip cutting problem. The substrate of the compound substrate can be cut directly in a grain cutting process.

According to the claimed invention, a light-emitting device with compound substrate comprises a compound substrate comprising a high thermal conductive layer and a substrate disposed around the high thermal conductive layer, an adhesive layer formed on the compound substrate, and a light-emitting stack layer formed on the adhesive layer.

The high thermal conductive layer comprises at least one material selected from a material group consisting of Cu, Al, Au, Ag, W, and alloys of these metals, or other substitute materials. The substrate comprises at least one material selected from a material group consisting of Si, GaAs, Ge, $Al_2O_3$, glass, InP, and GaP, or other substitute materials.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
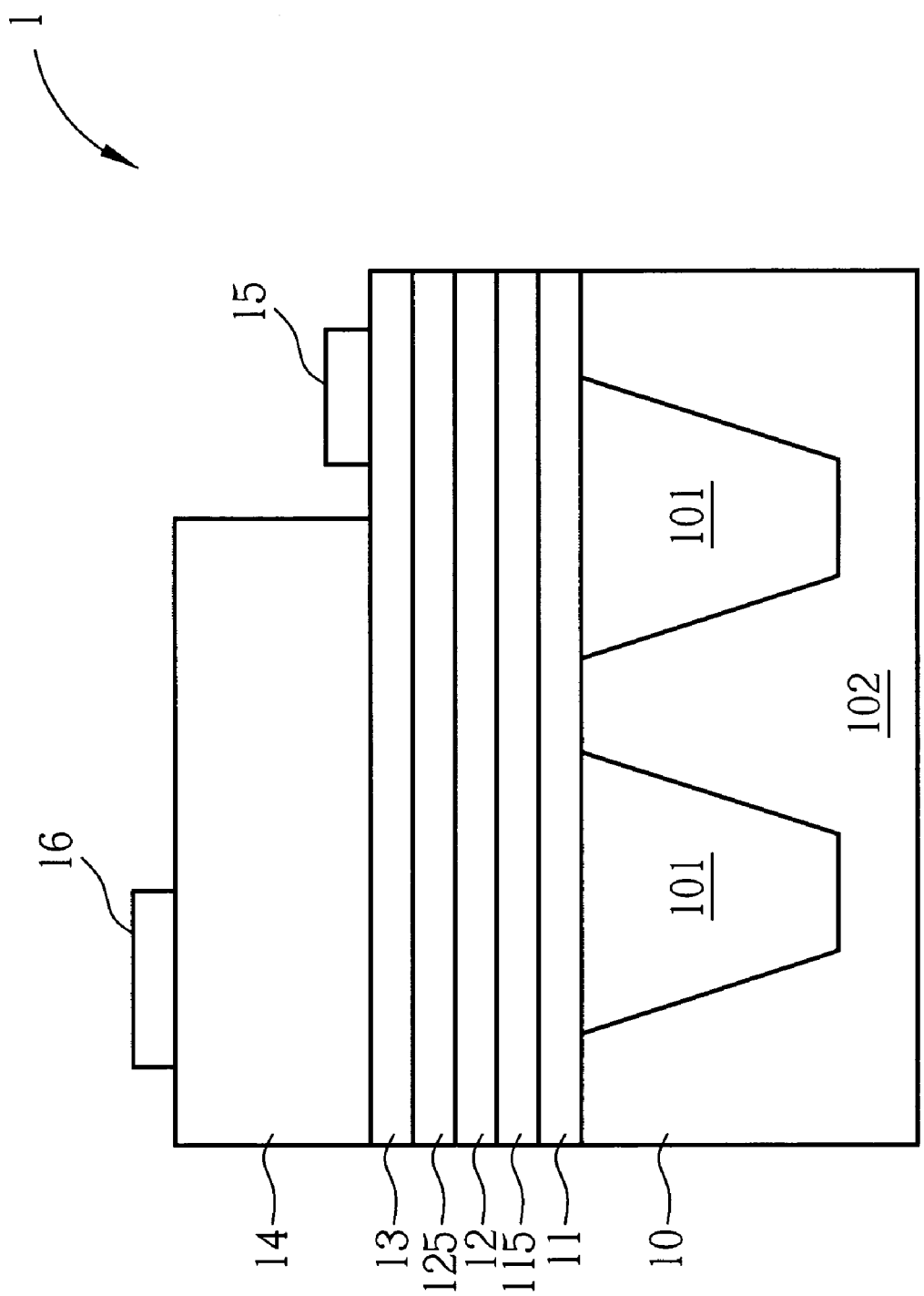
FIG. 1 is a side view of a light-emitting device with a compound substrate according to a preferred embodiment of the present invention.

Please refer to FIG. 1. FIG. 1 is a side view of a light-emitting device 1 with a compound substrate according to a preferred embodiment of the present invention. The light-emitting device 1 comprises a compound substrate 10 comprising a high thermal conductive layer 101 and a substrate 102 disposed around the high thermal conductive layer 101, a metal reflecting layer 11 formed on the compound substrate 10, a transparent adhesive layer 12 formed on the metal reflecting layer 11, a transparent conductive layer 13 formed on the transparent adhesive layer 12 wherein an upper surface of the transparent conductive layer 13 has a first section and a second section, a light-emitting stack layer 14 formed on the first section, a first electrode 15 formed on the second section, and a second electrode 16 formed on the light-emitting stack layer 14.

In the preferred embodiment, the light-emitting device 1 further comprises a first reaction layer 115 formed between the metal reflecting layer 11 and the transparent adhesive layer 12, and a second reaction layer 125 formed between the transparent adhesive layer 12 and the transparent conductive layer 13 to increase adhesive force.

In the preferred embodiment, the metal reflecting layer 11 can be formed between the transparent adhesive layer 12 and the transparent conductive layer 13. In addition, the transparent adhesive layer 12 can be replaced with an opaque adhesive layer, the metal reflecting layer 11 being formed between the opaque adhesive layer and the transparent conductive layer 13.

Figure 2:
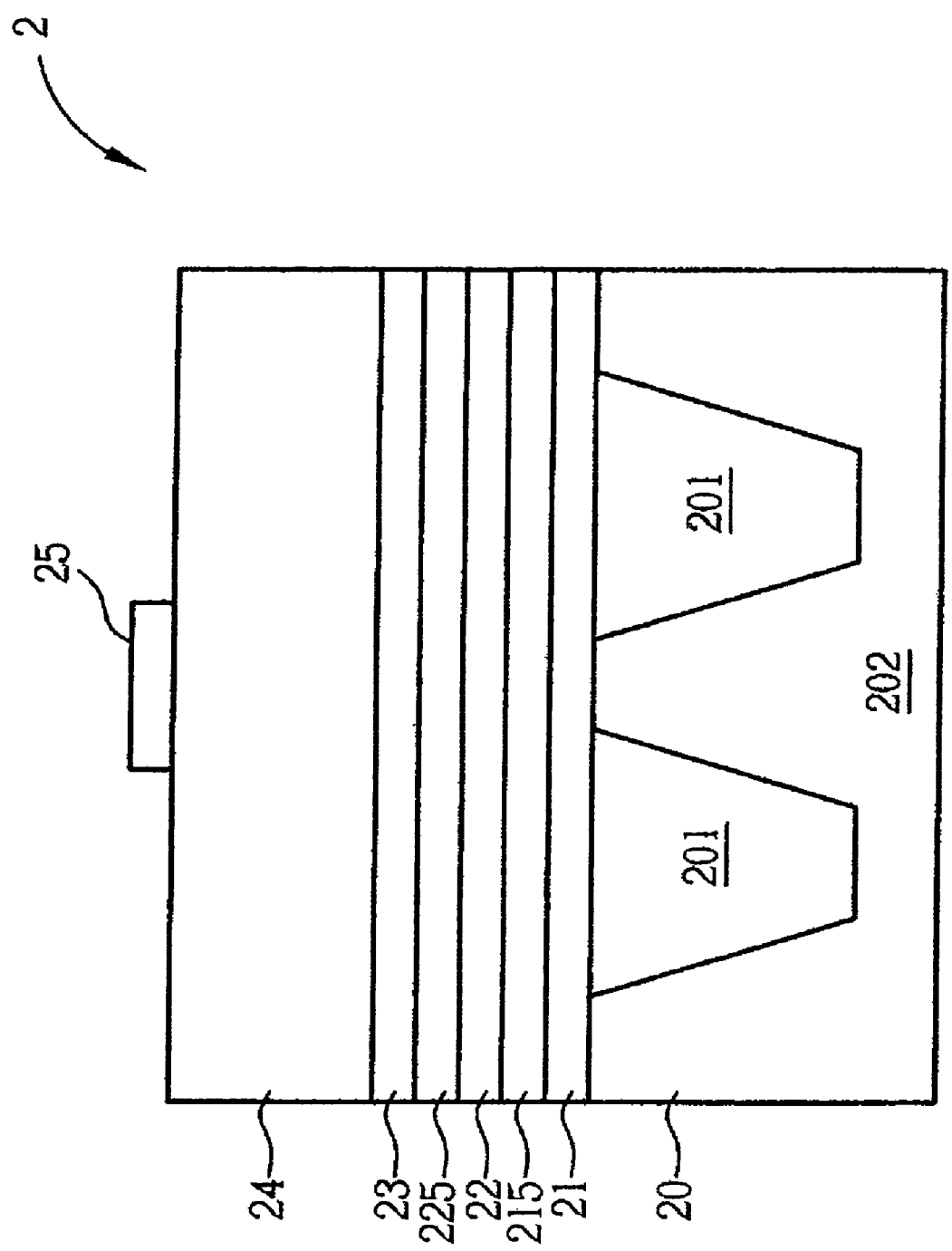
FIG. 2 is a side view of a light-emitting device with a compound substrate according to a second preferred embodiment of the present invention.

Please refer to FIG. 2. FIG. 2 is a side view of a light-emitting device 2 with a compound substrate according to the second preferred embodiment of the present invention. The light-emitting device 2 comprises a compound substrate 20 comprising a high thermal conductive layer 201 and a substrate 202 disposed around the high thermal conductive layer 201, a metal reflecting layer 21 formed on the compound substrate 20, a conductive transparent adhesive layer 22 formed on the metal reflecting layer 21, a transparent conductive layer 23 formed on the conductive transparent adhesive layer 22, a light-emitting stack layer 24 formed on the transparent conductive layer, an electrode 25 formed on the light-emitting stack layer 24.

In the second preferred embodiment, the light-emitting device 2 further comprises a first reaction layer 215 formed between the metal reflecting layer 21 and the conductive transparent adhesive layer 22, and a second reaction layer 225 formed between the conductive transparent adhesive layer 22 and the transparent conductive layer 23 to increase adhesive force.

In the second preferred embodiment, the metal reflecting layer 21 can be formed between the conductive transparent adhesive layer 22 and the transparent conductive layer 23. In addition, the conductive transparent adhesive layer 22 can be replaced with a conductive adhesive layer, the metal reflecting layer 21 being formed between the conductive adhesive layer and the transparent conductive layer 23.

Figure 3:
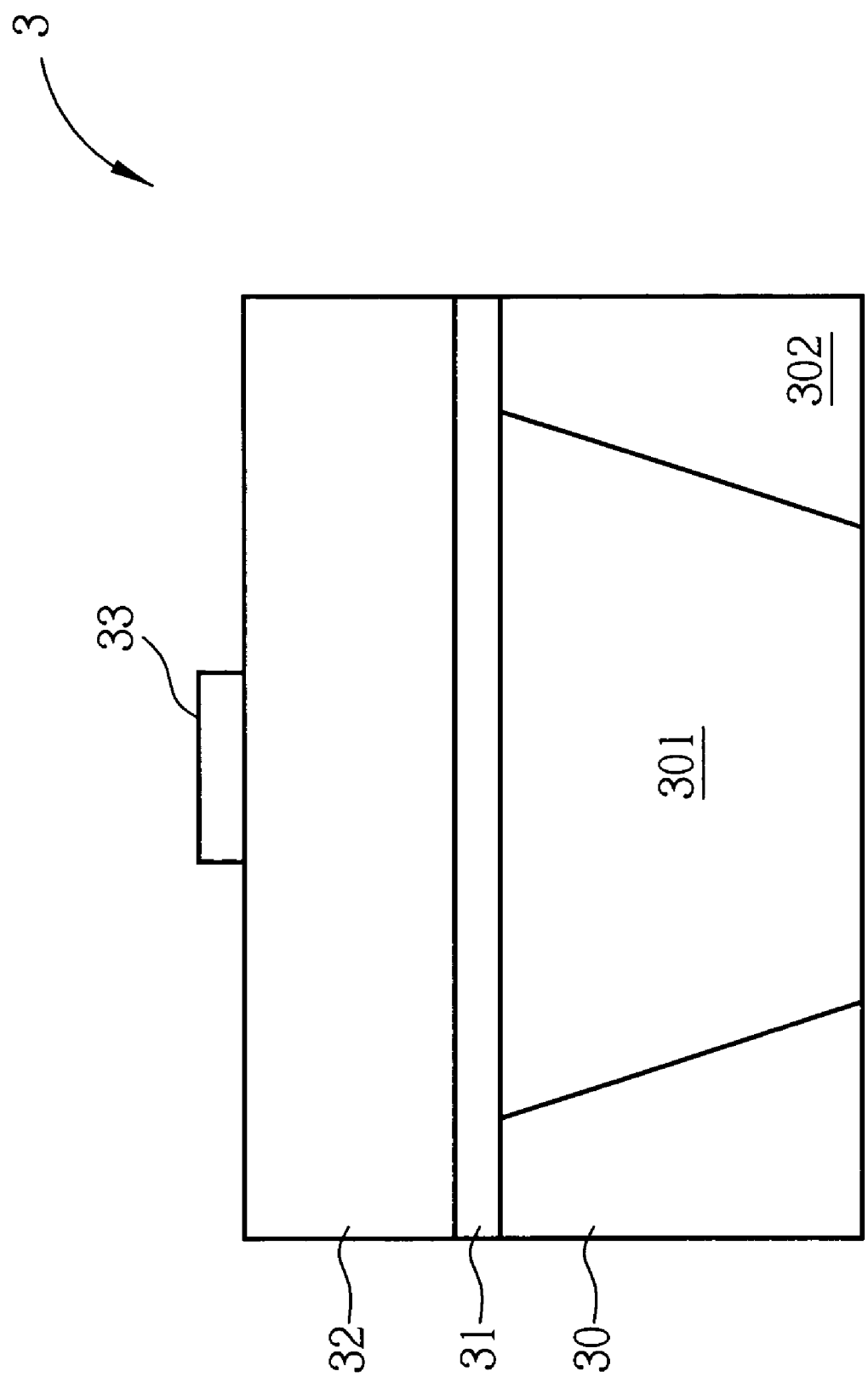
FIG. 3 is a side view of a light-emitting device with a compound substrate according to a third preferred embodiment of the present invention.

Please refer to FIG. 3. FIG. 3 is a side view of a light-emitting device 3 with a compound substrate according to a third preferred embodiment of the present invention. The light-emitting device 3 comprises a compound substrate 30 comprising a high thermal conductive layer 301 and a substrate 302 around the high thermal conductive layer 301, a metal adhesive layer 31 formed on the compound substrate 30, a light-emitting stack layer 32 formed on the metal adhesive layer 31, and a electrode 33 formed on the light-emitting stack layer 32.

In all preferred embodiments described, a connection layer can be formed between the high thermal conductive layer 101, 201, 301 and the substrate 102, 202, 302 of the compound substrate 10, 20, 30 to increase the adhesive force.

The present invention light-emitting device 1, 2, 3 can include one high thermal conductive layer 101, 201, 301 or a plurality of high thermal conductive layers. The forming method of the high thermal conductive layer 101, 201, 301 is selected from at least one method of: electroplating, electroforming, electrolysis plating, and are evaporation. The high thermal conductive layer 101, 201, 301 comprises at least one material selected from a material group consisting of Cu, Al, Au, Ag, W, and alloys of these metals, or other substitute materials. The connection layer comprises at least one material selected from a material group consisting of indium tin oxide, GeAn, BeAu, Au, SiNx, SiO2, Cu, Ti, and Pd, or other substitute materials. The substrate 10, 20, 30 comprises at least one material selected from a material group consisting of Si, GaAs, Ge, Al2O3, glass, laP, and GaP, or other substitute materials. The light-emitting stack layer 14, 24, 32 comprises at least one material selected from a material group consisting of AlGaIaP, AlInGaN, and AlGaAs series, or other substitute materials. The transparent adhesive layer 12 comprises at least one material selected from a material group consisting of polyimide (PI), benzocyclobutene (BCB), and perfluorocyclobutane (PFCB), or other substitute materials. The conductive transparent adhesive layer 22 comprises at least one material selected from a material group consisting of intrinsically conducting polymer and polymer doped with a conductive material, or other substitute materials, wherein the conductive material comprises at least one material selected from a material group consisting of indium tin oxide, cadmium tin oxide, antimony tin oxide, zinc oxide, zinc tin oxide, Au, and Ni/Au, or other substitute materials. The first reaction layer 115, 215 comprises at least one material selected from a material group consisting of SiNx, Ti, and Cr, or other substitute materials. The second reaction layer 125, 225 comprises at least one material selected from a material group consisting of SiNx, Ti, and Cr, or other substitute materials. The metal reflecting layer 11, 21 comprises at least one material selected from a material group consisting of Jn, Sn, Al Au, Pt, Zn, Ge, Ag, Ti, Pb, Pd, Cu, AuBe, AuGe, Ni, PbSn, and AuZn, or other substitute materials. The metal adhesive layer 31 comprises at least one material selected from a material group consisting of In, Sn, Al Au, Pt, Zn, Ge, Ag, Ti, Pb, Pd, Cu, AuBe, AuGe, Ni, PbSn, and AuZn, or other substitute materials.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A light-emitting device with compound substrate comprising:
   a compound substrate comprising a high thermal conductive layer and a substrate disposed around the high thermal conductive layer;
   a transparent adhesive layer formed on the compound substrate; and
   a light-emitting stack layer formed on the transparent adhesive layer.

2. The light-emitting device of claim 1 wherein the transparent adhesive layer is a conductive transparent adhesive layer.

3. The light-emitting device of claim 1 wherein the transparent adhesive layer is an insulating transparent adhesive layer.

4. The light-emitting device of claim 1 further comprising a first reaction layer between the compound substrate and the transparent adhesive layer.

5. The light-emitting device of claim 1 further comprising a second reaction layer between the transparent adhesive layer and the light-emitting stack layer.

6. The light-omitting device of claim 4 further comprising a metal reflecting layer between the compound substrate and the first reaction layer.

7. The light-emitting device of claim 5 further comprising a metal reflecting layer between the second reaction layer and the light-emitting stack layer.

8. The light-emitting device of claim 7 further comprising a transparent conductive layer between the metal reflecting layer and the light-emitting stack layer.

9. The light-emitting device of claim 1 further comprising a connection layer between the high thermal conductive layer and the substrate.

10. The light-emitting device of claim 1 wherein the high thermal conductive layer comprises at least one material selected from a material group consisting of Cu, Al, Au, Ag, W, and alloys of these metals.

11. The light-emitting device of claim 9 wherein the connection layer comprises at least one material selected from a material group consisting of indium tin oxide, GeAu, BeAu, Au, SiNx, SiO$_2$, Cu, Ti, and Pd.

12. The light-emitting device of claim 1 wherein the transparent adhesive layer comprises at least one material selected from a material group consisting of polyimide (PI), benzocyclobutane (BCB), and perfluorocyclobutene (PFCB).

13. The light-emitting device of claim 2 wherein the conductive transparent adhesive layer comprises at least one material selected from a material group consisting of intrinsically conducting polymer and polymer doped with a conductive material.

14. The light-emitting device of claim 13 wherein the conductive material comprises at least one material selected from a material group consisting of indium tin oxide, cadmium tin oxide, antimony tin oxide, zinc oxide, zinc tin oxide, Au, and Ni/Au.

15. The light-emitting device of claim 4 wherein the first reaction layer comprises at least one material selected from a material group consisting of SiNx, Ti, and Cr.

16. The light-emitting device of claim 5 wherein the second reaction layer comprises at least one material selected from a material group consisting of SiNx, Ti, and Cr.

17. A light-omitting device with compound substrate comprising:
- a compound substrate comprising a high thermal conductive layer and a substrate disposed around the high thermal conductive layer;
- an opaque adhesive layer formed on the compound substrate; and
- a light-emitting stack layer formed on the opaque adhesive layer.

18. The light-emitting device of claim 17 wherein the opaque adhesive layer is a conductive opaque adhesive layer.

19. The light-emitting device of claim 17 wherein the opaque adhesive layer is an insulating opaque adhesive layer.

20. The light-emitting device of claim 17 further comprising a first reaction layer between the compound substrate and the opaque adhesive layer.

21. The light-emitting device of claim 20 further comprising a second reaction layer between the opaque adhesive layer and the light-emitting stack layer.

22. The light-emitting device of claim 21 further comprising a metal reflecting layer between the second reaction layer and the light-emitting stack layer.

23. The light-emitting device of claim 22 further comprising a transparent conductive layer between the metal reflecting layer and the light-emitting stack layer.

24. The light-emitting device of claim 17 further comprising a connection layer between the high thermal conductive layer and the substrate.

25. The light-emitting device of claim 17 wherein the high thermal conductive layer comprises at least one material selected from a material group consisting of Cu, Al, Au, Ag, W, and alloys of these metals.

26. The light-emitting device of claim 24 wherein the connection layer comprises at least one material selected from a material group consisting of indium tin oxide, GeAu, BeAu, Au, SiNx, SiO2, Cu, Ti, and Pd.

27. The light-emitting device of claim 20 wherein the first reaction layer comprises at least one material selected from a material group consisting of SiNx, Ti, and Cr.

28. The light-emitting device of claim 21 wherein the second reaction layer comprises at least one material selected from a material group consisting of SiNx, Ti, and Cr.

29. A light-emitting device with compound substrate comprising:
- a compound substrate comprising a high thermal conductive layer and a substrate disposed around the high thermal conductive layer;
- a metal adhesive layer formed on the compound substrate;
- a metal reflecting layer formed on the metal adhesive layer; and
- a light-emitting stack layer formed on the metal reflecting layer.

30. The light-emitting device of claim 29 further comprising a transparent conductive layer between the metal reflecting layer and the light-emitting stack layer.

31. The light-emitting device of claim 29 further comprising a connection layer between the high thermal conductive layer and the substrate.

32. The light-emitting device of claim 29 wherein the high thermal conductive layer comprises at least one material selected from a material group consisting of Cu, Al, Au, Ag, W, and alloys of these metals.

33. The light-emitting device of claim 31 wherein the connection layer comprises at least one material selected from a material group consisting of indium tin oxide, GeAu, BeAu, Au, SiNx, $SiO_2$, Cu, Ti, and Pd.

34. The light-emitting device of claim 29 wherein the metal adhesive layer comprises at least one material selected from a material group consisting of In, Sn, Al, Au, Pt, Zn, Ge, Ag, Ti, Pb, Pd, Cu, and alloys of these metals.

35. The light-emitting device of claim 29 wherein the metal adhesive layer is a metal reflecting adhesive layer.

* * * * *